(12) United States Patent
Maleki et al.

(10) Patent No.: US 7,965,745 B2
(45) Date of Patent: Jun. 21, 2011

(54) RF AND MICROWAVE RECEIVERS BASED ON ELECTRO-OPTIC OPTICAL WHISPERING GALLERY MODE RESONATORS

(75) Inventors: Lutfollah Maleki, Pasadena, CA (US); Vladimir Ilchenko, Arcadia, CA (US); David Seidel, Alta Loma, CA (US)

(73) Assignee: OEwaves, Inc., Pasadena, CA (US)

( * ) Notice: Subject to any disclaimer, the term of this patent is extended or adjusted under 35 U.S.C. 154(b) by 182 days.

(21) Appl. No.: 12/288,015

(22) Filed: Oct. 14, 2008

(65) Prior Publication Data
US 2009/0097516 A1   Apr. 16, 2009

Related U.S. Application Data

(60) Provisional application No. 60/998,624, filed on Oct. 12, 2007.

(51) Int. Cl.
*H01S 3/10* (2006.01)
(52) U.S. Cl. ............... 372/26; 372/20; 372/32; 398/162
(58) Field of Classification Search ............... 372/20, 372/26
See application file for complete search history.

(56) References Cited

U.S. PATENT DOCUMENTS

| | | |
|---|---|---|
| 5,204,640 A | 4/1993 | Logan, Jr. |
| 5,220,292 A | 6/1993 | Bianchini et al. |
| 5,723,856 A | 3/1998 | Yao et al. |
| 5,751,747 A | 5/1998 | Lutes et al. |
| 5,777,778 A | 7/1998 | Yao |
| 5,917,179 A | 6/1999 | Yao |
| 5,929,430 A | 7/1999 | Yao et al. |
| 5,985,166 A | 11/1999 | Unger et al. |
| 6,080,586 A | 6/2000 | Baldeschwieler et al. |
| 6,178,036 B1 | 1/2001 | Yao |

(Continued)

FOREIGN PATENT DOCUMENTS
WO   01/96936   12/2001
(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Minsun Harvey
*Assistant Examiner* — Xnning Niu
(74) *Attorney, Agent, or Firm* — Perkins Coie LLP

(57) ABSTRACT

Among others, RF receivers based on whispering gallery mode resonators are described. In one aspect, a photonic RF device includes a laser that is tunable in response to a control signal and produces a laser beam at a laser frequency. The RF device includes a first optical resonator structured to support a whispering gallery mode circulating in the first optical resonator, the optical resonator being optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser. The RF device includes a second optical resonator made of an electro-optic material to support a whispering gallery mode circulating in the optical resonator.

10 Claims, 9 Drawing Sheets

U.S. PATENT DOCUMENTS

| | | | |
|---|---|---|---|
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,535,328 B2 | 3/2003 | Yao | |
| 6,567,436 B1 | 5/2003 | Yao et al. | |
| 6,580,532 B1* | 6/2003 | Yao et al. | 398/39 |
| 6,594,061 B2 | 7/2003 | Huang et al. | |
| 6,661,950 B1 | 12/2003 | Strecker | |
| 6,762,869 B2 | 7/2004 | Maleki et al. | |
| 6,795,481 B2 | 9/2004 | Maleki et al. | |
| 6,798,947 B2 | 9/2004 | Iltchenko | |
| 6,853,479 B1 | 2/2005 | Ilchenko et al. | |
| 6,871,025 B2 | 3/2005 | Maleki et al. | |
| 6,873,631 B2 | 3/2005 | Yao et al. | |
| 6,879,752 B1 | 4/2005 | Ilchenko et al. | |
| 6,901,189 B1 | 5/2005 | Savchenkov et al. | |
| 6,906,309 B2 | 6/2005 | Sayyah et al. | |
| 6,922,497 B1 | 7/2005 | Savchenkov et al. | |
| 6,928,091 B1 | 8/2005 | Maleki et al. | |
| 6,943,934 B1 | 9/2005 | Ilchenko et al. | |
| 6,987,914 B2 | 1/2006 | Savchenkov et al. | |
| 7,024,069 B2 | 4/2006 | Savchenkov et al. | |
| 7,043,117 B2 | 5/2006 | Matsko et al. | |
| 7,050,212 B2 | 5/2006 | Matsko et al. | |
| 7,061,335 B2 | 6/2006 | Maleki et al. | |
| 7,062,131 B2 | 6/2006 | Ilchenko | |
| 7,092,591 B2 | 8/2006 | Savchenkov et al. | |
| 7,133,180 B2 | 11/2006 | Ilchenko et al. | |
| 7,173,749 B2 | 2/2007 | Maleki et al. | |
| 7,184,451 B2 | 2/2007 | Ilchenko et al. | |
| 7,187,870 B2* | 3/2007 | Ilchenko et al. | 398/161 |
| 7,218,662 B1 | 5/2007 | Ilchenko et al. | |
| 7,248,763 B1 | 7/2007 | Kossakovski et al. | |
| 7,260,279 B2 | 8/2007 | Gunn et al. | |
| 7,283,707 B1 | 10/2007 | Maleki et al. | |
| 7,369,722 B2 | 5/2008 | Yilmaz et al. | |
| 7,389,053 B1 | 6/2008 | Ilchenko et al. | |
| 7,400,796 B1 | 7/2008 | Kossakovski et al. | |
| 7,440,651 B1 | 10/2008 | Savchenkov et al. | |
| 7,460,746 B2 | 12/2008 | Maleki et al. | |
| 2001/0038651 A1 | 11/2001 | Maleki et al. | |
| 2002/0018611 A1 | 2/2002 | Maleki et al. | |
| 2002/0018617 A1 | 2/2002 | Iltchenko et al. | |
| 2002/0021765 A1 | 2/2002 | Maleki et al. | |
| 2002/0081055 A1 | 6/2002 | Painter et al. | |
| 2002/0085266 A1 | 7/2002 | Yao | |
| 2002/0097401 A1 | 7/2002 | Maleki et al. | |
| 2003/0160148 A1 | 8/2003 | Yao et al. | |
| 2004/0100675 A1 | 5/2004 | Matsko et al. | |
| 2004/0109217 A1 | 6/2004 | Maleki et al. | |
| 2004/0218880 A1 | 11/2004 | Matsko et al. | |
| 2004/0240781 A1 | 12/2004 | Savchenkov et al. | |
| 2005/0017816 A1 | 1/2005 | Ilchenko et al. | |
| 2005/0063034 A1 | 3/2005 | Maleki et al. | |
| 2005/0074200 A1 | 4/2005 | Savchenkov et al. | |
| 2005/0123306 A1 | 6/2005 | Ilchenko et al. | |
| 2005/0128566 A1 | 6/2005 | Savchenkov et al. | |
| 2005/0175358 A1 | 8/2005 | Ilchenko et al. | |
| 2005/0248823 A1 | 11/2005 | Maleki et al. | |
| 2007/0009205 A1 | 1/2007 | Maleki et al. | |
| 2007/0153289 A1 | 7/2007 | Yilmaz et al. | |
| 2008/0001062 A1 | 1/2008 | Gunn et al. | |
| 2008/0075464 A1 | 3/2008 | Maleki et al. | |
| 2008/0310463 A1 | 12/2008 | Maleki et al. | |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J. Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hossein-Zadeh, M., et al., "Mb/s data transmission over a RF fiber-optic link using a $LiNbO_3$ microdisk modulator," *Solid-State Electronics*, 46(12):2173-2178, Dec. 2002.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Sub-Micro Watt Photonic Microwave Receiver," *IEEE Photonics Technology Letters*, 14(11):1602-1604, Nov. 2002.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled LiNbO₃," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12): 2988-2997, Dec. 2007.

Vassiliev, V.V., et al., "Narrow-Line-Width Diode Laser with a High-Q Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

International Search Report and Written Opinion dated Mar. 31, 2009 for International Application No. PCT/US2008/011778, filed Oct. 14, 2008 (6 pages).

\* cited by examiner

RF AND MICROWAVE RECEIVERS BASED ON ELECTRO-OPTIC OPTICAL WHISPERING GALLERY MODE RESONATORS

PRIORITY CLAIM AND RELATED APPLICATIONS

This application claims the benefits of the following two applications:

U.S. patent application Ser. No. 12/157,915, entitled "RF AND MICROWAVE RECEIVERS BASED ON WHISPERING GALLERY MODE RESONATORS" and filed on Jun. 13, 2008, which claims benefit of U.S. Provisional Application No. 60/934,800 entitled "Quadratic Photonic Receiver Based on Lithium Niobate Resonance Modulator with Optical Injection" and filed Jun. 13, 2007; and U.S. Provisional Application No. 60/998,624 entitled "Superheterodyne receiver based on electro-optic high-Q resonator used as both modulator and optical delay for OEO" and filed Oct. 12, 2007.

The disclosure of the above referenced patent applications are incorporated by reference as part of the specification of this application.

BACKGROUND

This application relates to optical resonators and optical devices based on optical resonators.

Optical resonators may be used to spatially confine resonant optical energy in a limited cavity with a low optical loss. The resonance of an optical resonator may be used to provide various useful functions such as optical filtering, optical modulation, optical amplification, optical delay, and others. Light can be coupled into or out of optical resonators via various coupling mechanisms according to the configurations of the resonators. For example, Fabry-Perot optical resonators with two reflectors at two terminals may use partial optical transmission of at least one reflector to receive or export light.

Optical whispering gallery mode (WGM) resonators confine light in a whispering gallery mode that is totally reflected within a closed circular optical path. Unlike Fabry-Perot resonators, light in WGM resonators cannot exit the resonators by optical transmission. Light in a WGM resonator "leaks" out of the exterior surface of the closed circular optical path of a WGM resonator via the evanescent field of the WG mode. An optical coupler can be used to couple light into or out of the WGM resonator via this evanescent field.

SUMMARY

The specification of this application describes, among others, examples and implementations of RF receivers based on whispering gallery mode resonators.

In one example, a photonic RF device includes a laser that is tunable in response to a control signal and produces a laser beam at a laser frequency; and an optical resonator structured to support a whispering gallery mode circulating in the optical resonator. Thee optical resonator is optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser. The optical resonator exhibits an electro-optic effect in response to a control signal. This device includes electrodes formed on the optical resonator to apply the control signal to the optical resonator; an RF circuit that receives an RF signal carrying a baseband signal and applies the RF signal to the electrodes on the optical resonator at a frequency equal to a free spectral range of the optical resonator; a first optical detector coupled to detect modulated light coupled out of the optical resonator to produce a baseband signal of the input RF signal; a second optical detector coupled to detect modulated light coupled out of the optical resonator to produce a feedback signal; and an electrical feedback that applies the feedback signal to the electrodes to perform optical modulation in the optical resonator.

In another example, an RF photonic device includes a laser that is tunable in response to a control signal and produces a laser beam at a laser frequency and a first optical resonator structured to support a whispering gallery mode circulating in the optical resonator. The first optical resonator is optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser. The device includes a second optical resonator made of an electro-optic material to support a whispering gallery mode circulating in the optical resonator and the second optical resonator is optically coupled to the laser to receive a portion of the laser beam from the laser. An RF circuit is provided and receives an RF signal carrying a baseband signal and modulates the second optical resonator at a frequency equal to a free spectral range of the second optical resonator. A slow optical detector coupled to detect modulated light coupled out of the second optical resonator to produce a baseband signal of the input RF signal.

These and other examples and implementations are described in detail in the drawings, the detailed description, and the claims.

DETAILED DESCRIPTION

Figure 1:
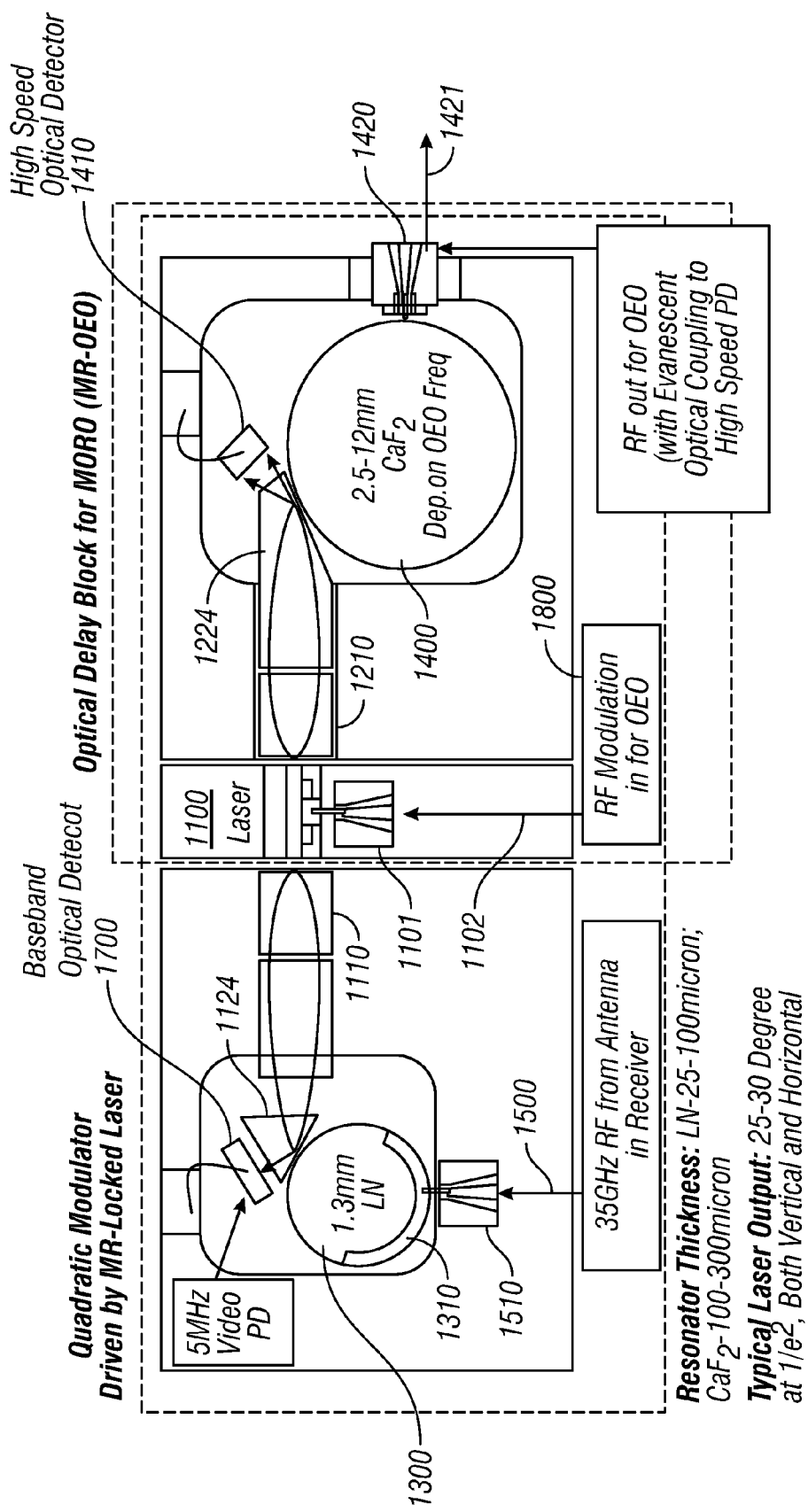
FIG. 1 shows an example of an RF receiver based on a laser stabilized by a WGM resonator and an electro-optic WGM resonator modulator driven by the stabilized laser.

FIG. 1 shows an example of an RF receiver based on a laser 1100 stabilized by a WGM resonator 1400. A diode laser 1100 is optically coupled to a resonator 1400 on the right hand-side based on optical injection locking. The laser output is directed via a GRIN lens coupler 1210 and an optical WGM evanescent coupler 1224 to direct laser light into the WGM resonator 1400. The feedback light of the resonator 1400 is injected back to the laser 1100 to stabilize the laser 1100 so that the laser wavelength is locked at the wavelength of the WGM mode in the resonator 1400 and to reduce the linewidth of the laser 1100. One way to achieve this injection locking is described in U.S. patent application Ser. No. 12/139,449 entitled "TUNABLE LASERS LOCKED TO WHISPERING GALLERY MODE RESONATORS" and filed on Jun. 13, 2008, which is incorporated by reference as part of the specification of this application.

In FIG. 1, the main components for the receiver are on the left-hand side of the laser 1100. A high sensitivity lithium niobate resonance WGM light modulator is provided to receive the stabilized laser light from the laser 1100 and to modulate the received light based on the received RF signal 1500 via an RF port 1126 (e.g., at 35 GHz). The modulator includes an electro-optical WGM resonator 1300 made of an electro-optic material and has electrodes 1310 formed thereon to apply a control voltage to change the index of the resonator to cause optical modulation to light confined in one or more WG modes. The RF port 1126 is electrically coupled to the electrodes 1310 on the resonator 1300 to apply the received RF signal 1500 to the resonator 1300 to modulate light inside the resonator 1300. An optical evanescent coupler 1124, such as an optical prism, is provided to provide optical coupling to and from the WGM resonator 1300. The laser light from the laser 1100 is injected via evanescent coupling into the resonator 1300 and to retrieve light inside the resonator 1300 from the resonator 1300 as output light. This output light can be coupled into a photodetector 1700, which can be a detector of a sufficient response speed to detect the baseband RF signal modulated onto the light by the modulator 1300 in response to the received RF signal 1500 at the RF port 1126. As an example, the detector 1700 can be a 5-MHz photodiode that detects video signals.

Therefore, the RF receiver in FIG. 1 receives the RF signal 1500 carrying a baseband signal at the input RF port 1126 and outputs the baseband signal at the photodetector 1700. The down-conversion operation is carried out in the optical domain by the optical modulator 1300. As such, the RF receiver is a photonic-based receiver with an optical core or engine.

Figure 1A:
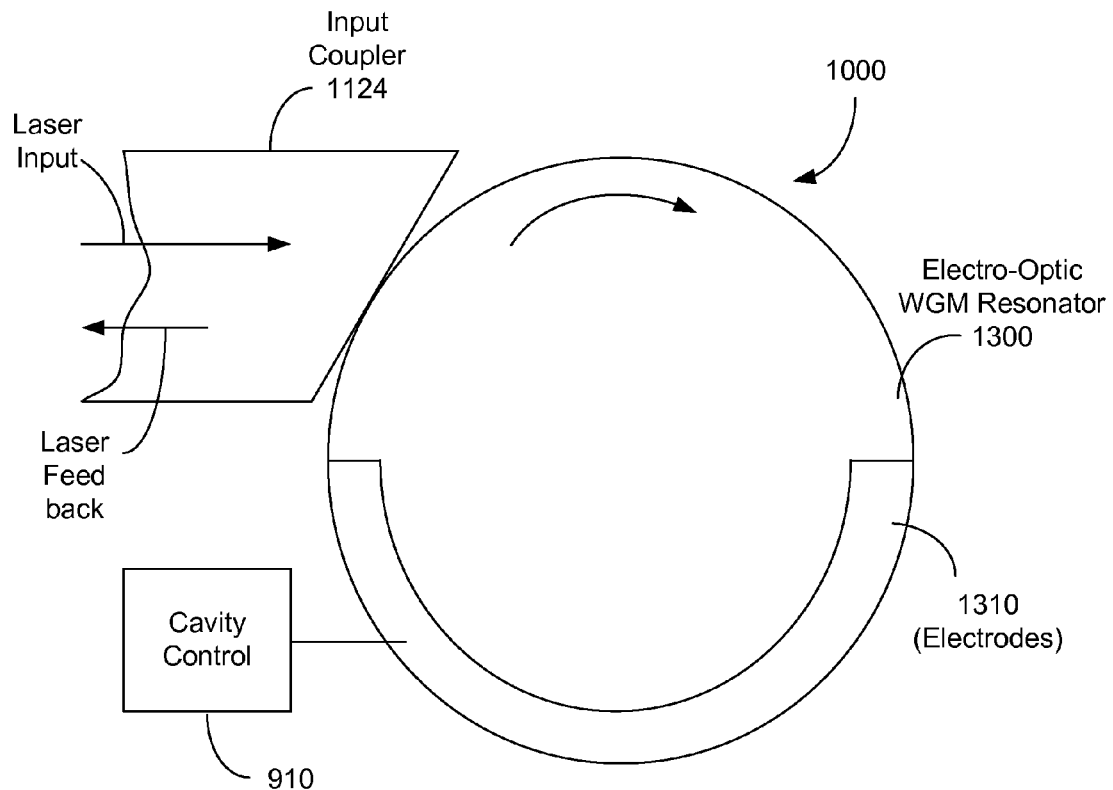
FIGS. 1A and 1B show an example of an electro-optic WGM resonator used for optical modulation in FIG. 1.
Figure 1B:
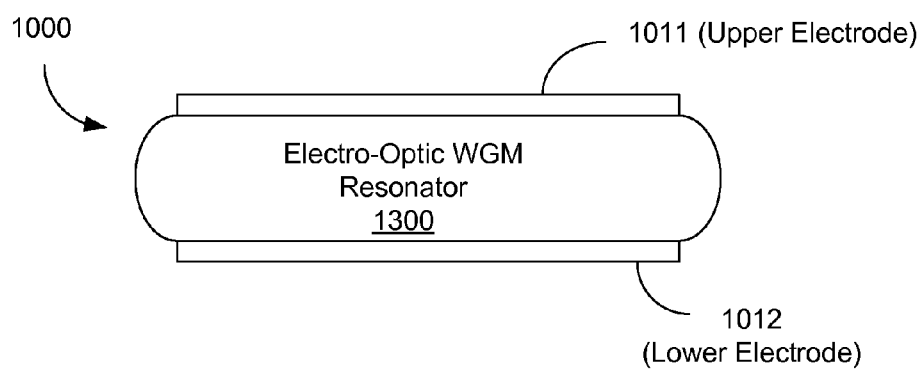

FIGS. 1A and 1B show an example of a tunable electro-optic WGM resonator 1000 suitable for use for the modulator with the resonator 1300 in FIG. 1. The electro-optic material for the resonator 1000 may be any suitable material, including an electro-optic crystal such as Lithium Niobate and semiconductor multiple quantum well structures. One or more electrodes 1011 and 1012 (as the electrodes 1310 in FIG. 1) may be formed on the resonator 1000 to apply the control electrical field in the region where the WG modes are present to control the index of the electro-optical material and to change the filter function of the resonator. Assuming the resonator 1000 has disk or ring geometry, the electrode 1011 may be formed on the top of the resonator and the electrode 1012 may be formed on the bottom of the resonator as illustrated in the side view of the device in FIG. 1B. In one implementation, the electrodes 1011 and 1012 may constitute an RF or microwave resonator to apply the RF or microwave signal to co-propagate along with the desired optical WG mode. The electrodes 1011 and 1012 may be microstrip line electrodes. A varying DC voltage can be applied to tune the WGM frequency and an RF or microwave signal, which includes the RF signal 1500, can be applied to modulate the WGM frequency.

The laser locking part of the RF receiver in FIG. 1 can include an optical detector 1410 that receives output light from the coupler 1224 to monitor the laser locking condition. A second optical detector 1420 can be coupled to the resonator 1400 to detect light in the resonator 1400 to produce an output signal 1421 as an RF output for the RF receiver in FIG. 1. The laser 1100 has an electrical input 1101 to receive an RF signal 1102 for opto-electronic oscillation operation.

Figure 2:
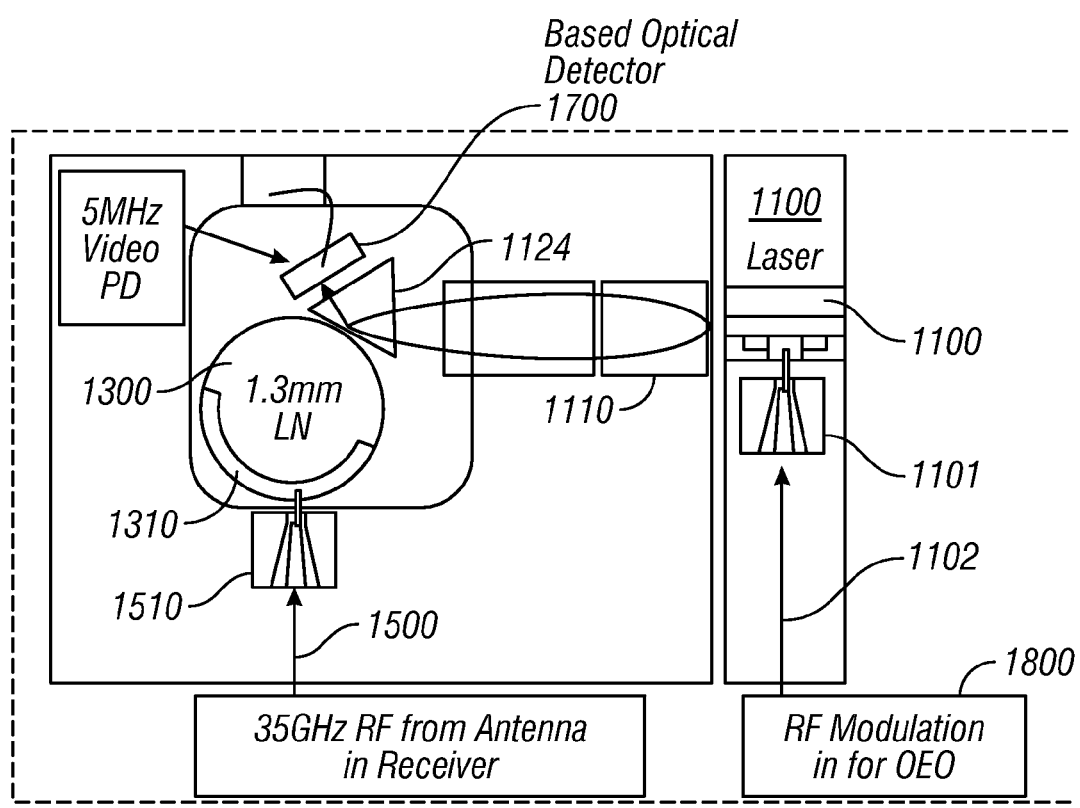
FIG. 2 shows an example of an RF receiver based on optical injection locking of a laser to an electro-optic WGM resonator that operates to both stabilize the laser via injection locking and to provide optical modulation via its electro-optic effect in response to a received RF signal.

FIG. 2 shows another RF receiver which has only the electro-optic WDM resonator 1300 without the second WGM resonator 1400 for locking the laser 1100. The resonator 1300 performs dual functions: an optical modulator for modulating the light in response to the received RF signal 1500 and an optical injection locking frequency reference to provide a narrow frequency reference to lock the laser 1100. This design is to simplify the implementation of the receiver in which the standalone narrow-linewidth laser 1100 is electronically locked to a lithium niobate resonator mode of the resonator 1300. The injection locking is achieved by optical feedback produced by the LN resonator 1300 itself. In presence of significant intracavity backscattering, the feedback can be achieved automatically by optical coupling methods between the laser 1100 and the resonator 1300, such as prism coupling, during which light is inserted into a traveling WG mode inside the resonator 1300, and is reflected in the cavity mode itself into the laser 1100, forcing the laser to lase at the frequency of the WG mode for the injection locking In absence of significant intracavity backscattering, in a first embodiment, a diffractive coupler can be used to excite a standing-wave WG mode in the lithium niobate resonator 1300 directly. Because this coupling is reciprocal, the laser will receive optical feedback from the resonator automatically.

In the second embodiment, a partial mirror is placed after the traveling-wave coupler to WG mode, and partial standing wave is created between laser 1100 and this mirror. This standing wave will produce coupling to the corresponding standing-wave WG mode in the resonator 1300, and will provide high Q optical feedback from the WG mode into the laser 1100 for injection locking and linewidth narrowing. As a result, a simple and inexpensive optical scheme of quadratic photonic receiver can be realized.

In operation, the RF frequency is equal to the free spectral range of the optical resonator 1300. The optical detector 1700 is used at the output of the optical resonator 1300 to detect the baseband signal carried by the RF signal 1500. Hence, the RF signal at the input of the device is now converted to a baseband signal. The electro-optic WGM resonator 1300 is used to provide both injection locking and the signal modulation.

Figure 3:
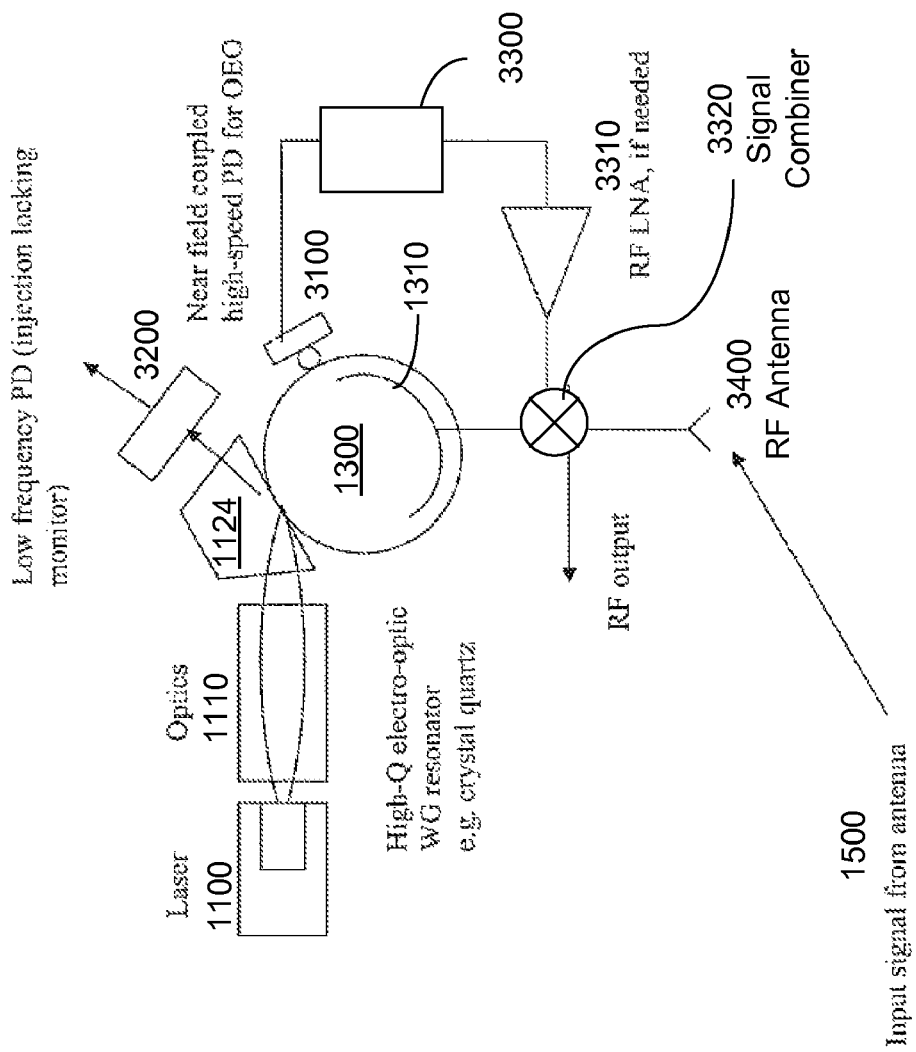
FIGS. 3 and 4 show two exemplary implementations of an RF receiver based on the receiver design in FIG. 2 where an optical detector is coupled to the WGM resonator and a feedback loop to the WGM resonator is provided to construct an opto-electronic oscillator.

FIG. 3 shows one implementation of an RF receiver with a single WGM resonator for modulation and laser injection locking. A near-field coupled high speed photodiode 3100 is evanescently coupled the resonator 1300 to detect light and to produce a detector signal to a feedback control circuit 3300 which conditions the signal, e.g., controlling the phase or delay of the signal and filtering the signal to select a particular frequency in the feedback loop. An amplifier 3310 is connected downstream from the circuit 330 to amplify the signal as a feedback signal to a signal combiner 3320. The signal combiner 3320 is coupled to an antenna or receiver circuit 3400 that receives the RF signal 1500 and combines the signal from the amplifier 3310 and the RF signal 1500 into a control signal. This control signal is fed into the electrodes 1310 on the resonator 1300 to modulate the light inside the modulator 1300. This design forms an opto-electronic loop with an optical portion that includes the optical resonator 1300 as an optical delay element and an optical modulator, and an electrical portion which includes the photodiode 3100, the circuit 3300, the amplifier 3310, the signal combiner 3320 and the electrodes 1300. This is a closed loop and can be operated to have a loop gain higher than the loop loss and the feedback to the resonator 1300 can be in phase. Under such conditions, the closed loop is a positive feedback loop and will oscillate as an opto-electronic oscillator (OEO) at a frequency at which the light in the resonator 1300 is modulated. In this OEO, the laser light from the laser 1100 is also modulated due to the feedback light from the resonator 1300. The resonator 1300 provide the optical delay in the loop to reduce the phase noise of the loop that may be difficult to achieve with a conventional RF voltage-controlled oscillator. As indicated, an RF output can be generated in the electrical portion of the opto-electronic loop, e.g., at the signal combiner 3320. A second detector 3200 is used to provide low frequency detection for monitoring the injection locking operation.

Figure 4:
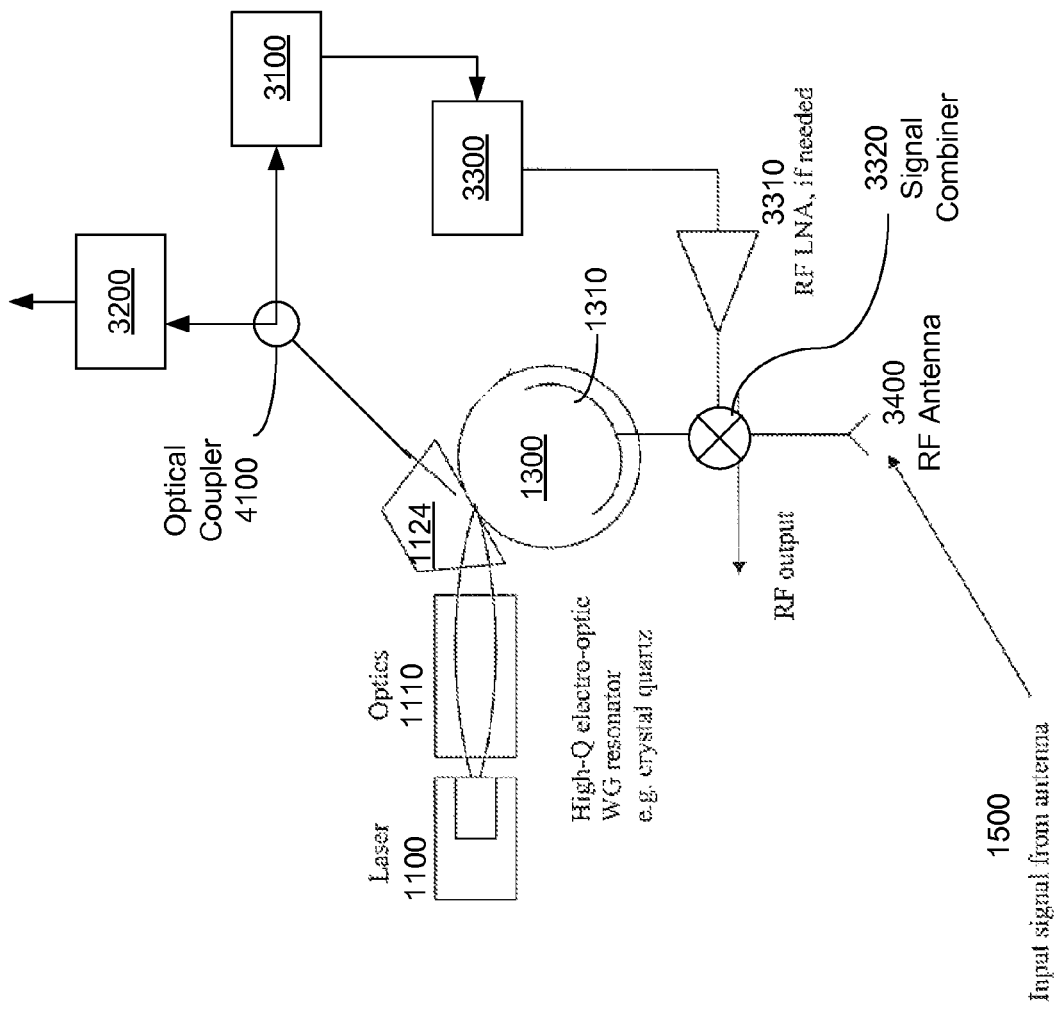

FIG. 4 shows a variation of the receiver in FIG. 3 where an optical coupler 4100 is provided to receive output light from the coupler 1124 that provides optical coupling between the laser 1100 and the resonator 1300. The detector 3100 for the OEO is used to receive a portion light from the coupler 4100 and the second detector 3200 is used for monitoring the injection locking. This design needs only one evanescent coupler 1124 in comparison with the design in FIG. 3 which needs two: one for the detector 3100 and another one (1124) for injection locking with the laser 1100.

Figure 5:
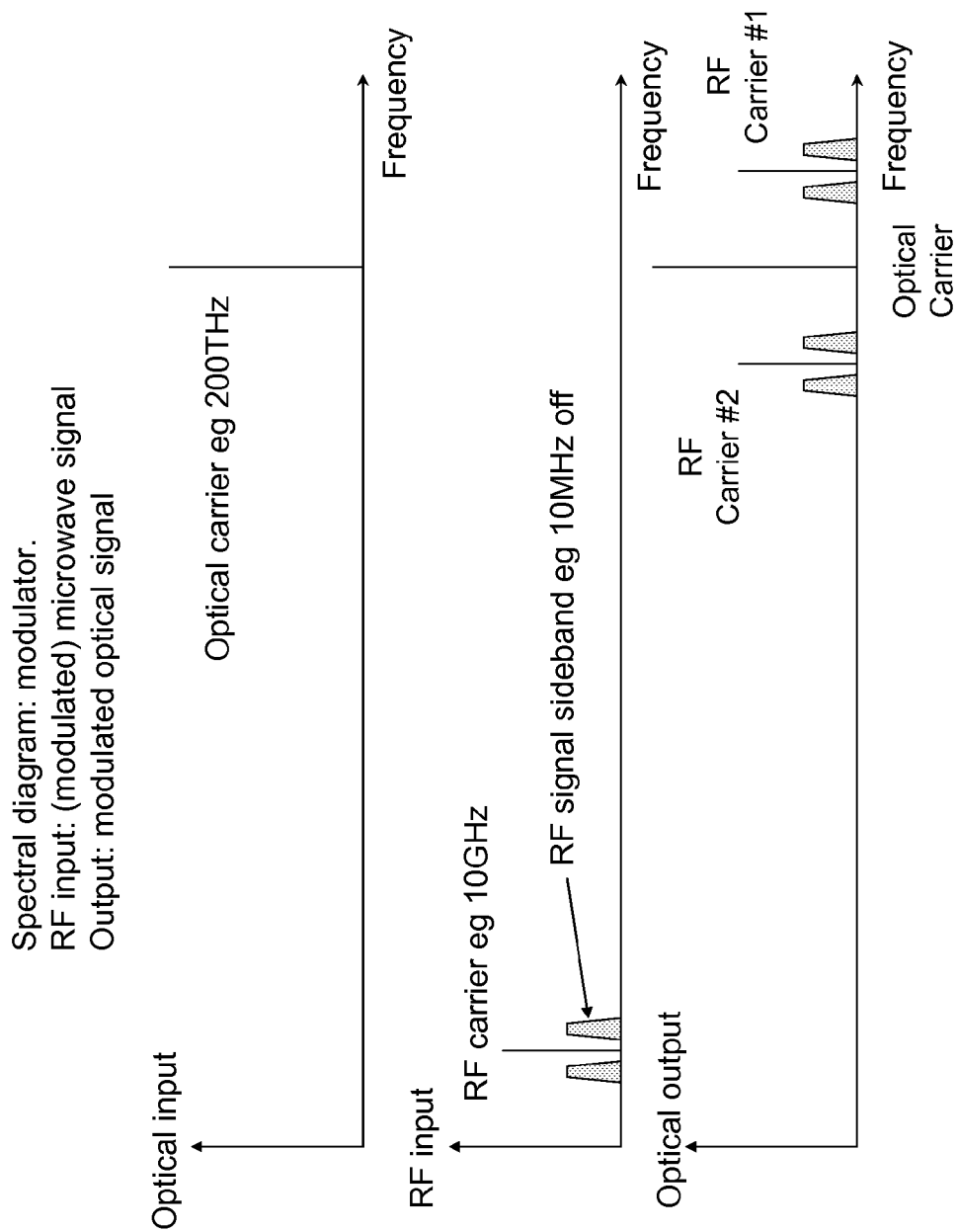
FIGS. 5, 6 and 7 show operations of an RF receiver based on the design in FIGS. 1-4.
Figure 6:
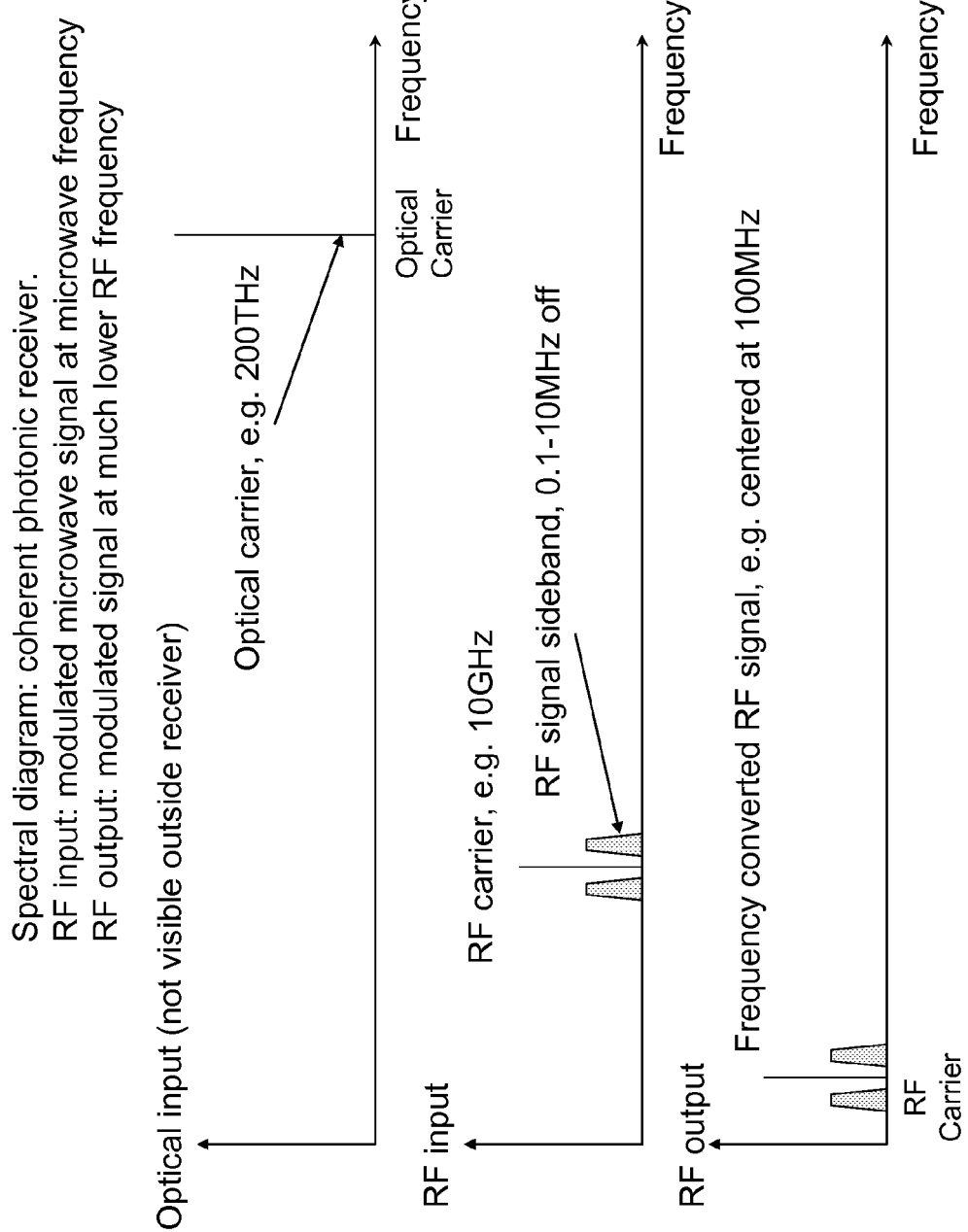
Figure 7:
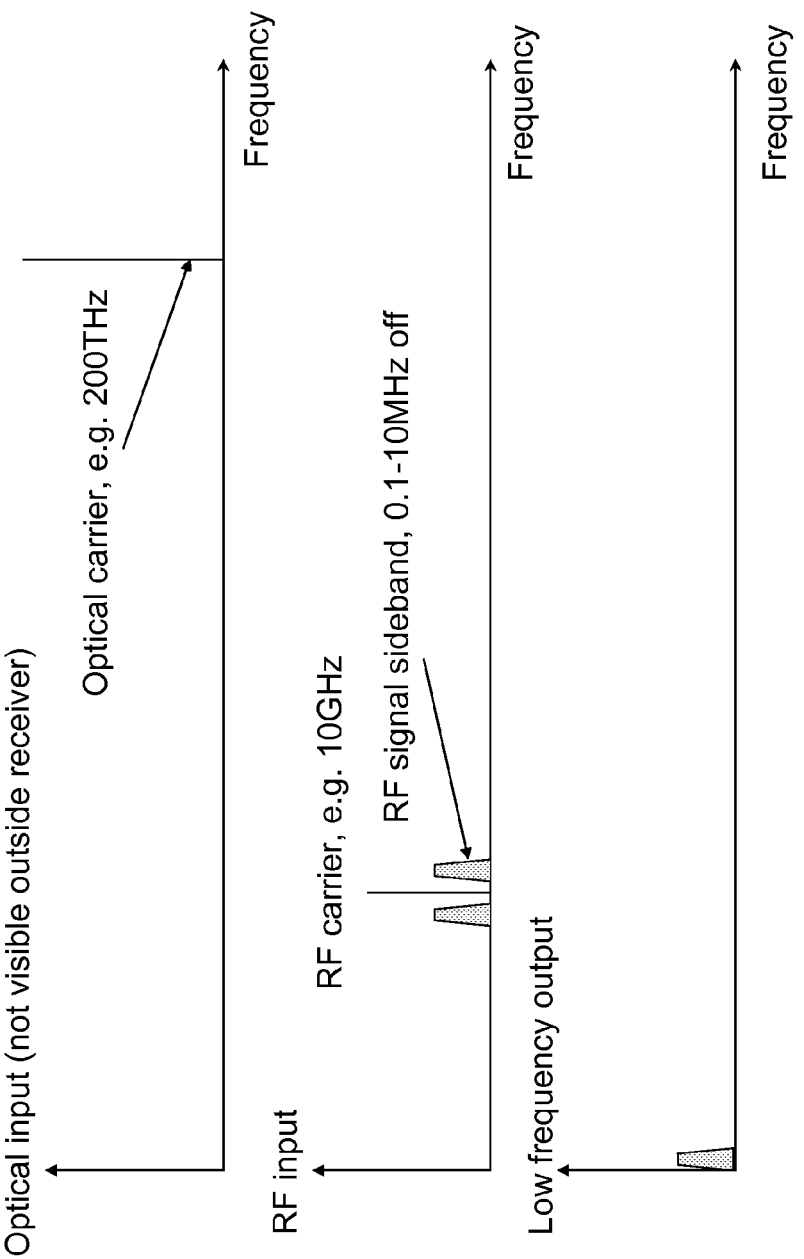

FIGS. 5, 6 and 7 illustrate operations of the RF receiver in the frequency domain to show optical demodulation or frequency down-conversion in detecting the baseband signal carried by the RF signal 1500. As illustrated, the oscillation frequency of the OEO, which is the frequency at which the light is modulated in the resonator 1300, can be selected to achieve a desired frequency down-conversion in the optical domain. As illustrated in FIG. 7, such a photonic RF receiver can be used to directly detect the baseband signal at the detector 1700, thus significantly simplifying the RF circuitry. The WGM resonator 1300 can be a resonator with a high Q value to produce significant advantages for the device performance and operations.

Figure 8:
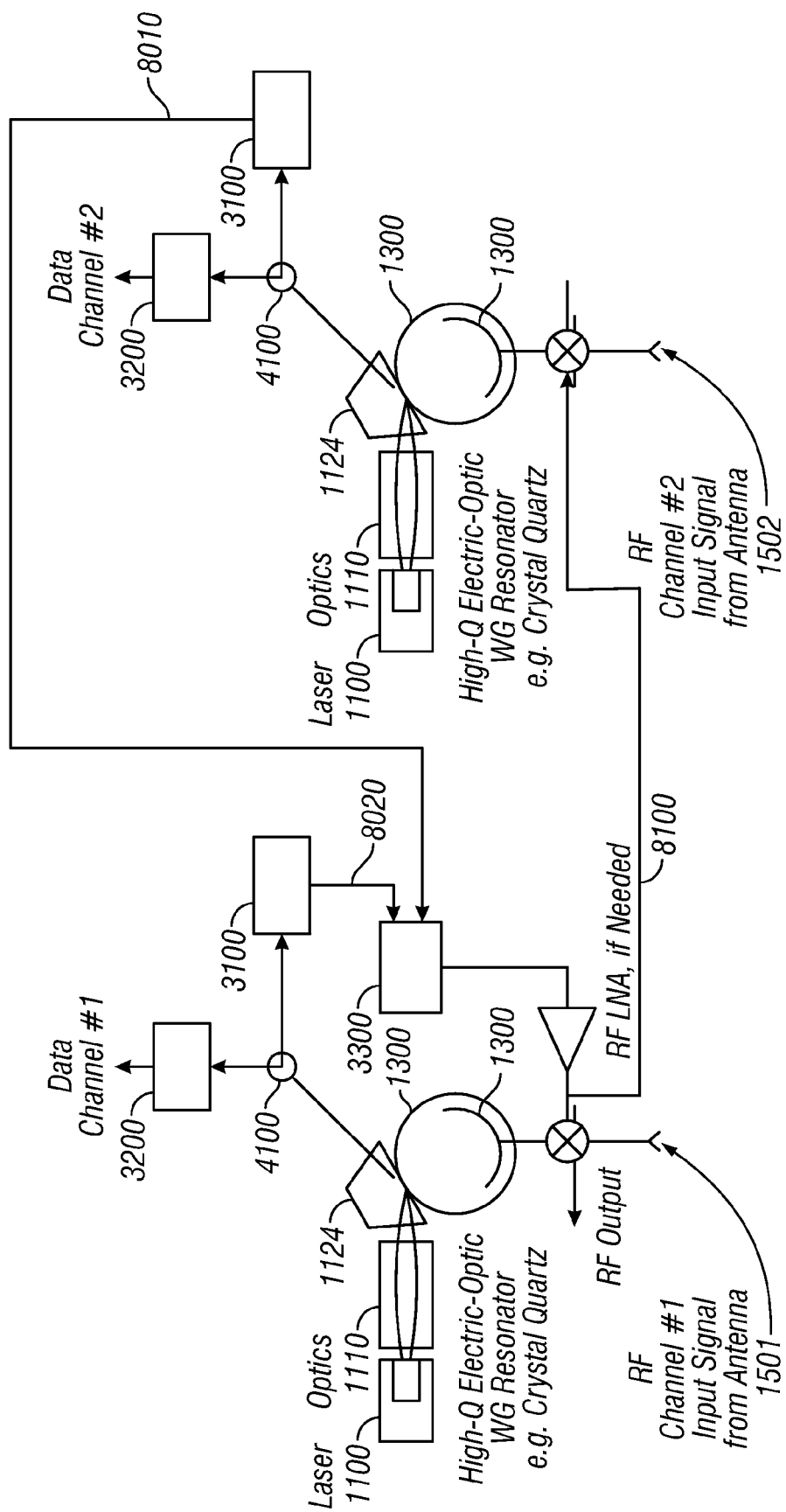
FIG. 8 shows an example of a multi-channel RF receiver formed by two or more RF receivers shown in FIGS. 1-4 that share a common feedback loop for the opto-electronic oscillation in each WGM resonator.

FIG. 8 shows a multi-channel RF receiver system with two or more RF receivers with interconnected 0E0 loops. In this example, two RF receivers are linked to receive two RF signals 1501 and 1502 carrying two different baseband signals. The electrical feedback signals 8010 and 8020 are combined at the circuit 3300 to produce a single feedback signal output by the amplifier. The feedback signal is split into two signals, one for each resonator. This design provides synchronous RF local oscillators that are in phase with each other. Three or more photonic receivers can be so linked to operate in synchronization.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations, enhancements and other implementations can be made based on what is described and illustrated in this patent application.

What is claimed is:

1. A photonic RF device, comprising:
a laser that is tunable in response to a control signal and produces a laser beam at a laser frequency;
a first optical resonator structured to support a whispering gallery mode circulating in the first optical resonator, the optical resonator being optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser;
a second optical resonator made of an electro-optic material to support a whispering gallery mode circulating in the optical resonator, the second optical resonator being optically coupled to the laser to receive a portion of the laser beam from the laser;
an RF circuit that receives an input RF signal carrying a baseband signal and modulates the second optical resonator at a frequency equal to a free spectral range of the second optical resonator to cause optical modulation in the received portion of the laser beam so the modulated light inside the second optical modulator carries the baseband signal; and
a slow optical detector coupled to detect modulated light coupled out of the second optical resonator to produce a baseband signal of the input RF signal.

2. A photonic RF device, comprising:
a laser that is tunable in response to a control signal and produces a laser beam at a laser frequency;
an optical resonator structured to support a whispering gallery mode circulating in the optical resonator, the optical resonator being optically coupled to the laser to receive a portion of the laser beam into the optical resonator in the whispering gallery mode and to feed laser light in the whispering gallery mode in the optical resonator back to the laser to stabilize the laser frequency at a frequency of the whispering gallery mode and to reduce a linewidth of the laser, the optical resonator exhibiting an electro-optic effect in response to a control signal;
electrodes formed on the optical resonator to apply the control signal to the optical resonator;
an RF circuit that receives an input RF signal carrying a baseband signal and applies the input RF signal to the electrodes on the optical resonator at a frequency equal to a free spectral range of the optical resonator;
a first optical detector coupled to detect modulated light coupled out of the optical resonator to produce a baseband signal of the input RF signal;
a second optical detector coupled to detect modulated light coupled out of the optical resonator to produce a feedback signal; and
an electrical feedback that applies the feedback signal to the electrodes to perform optical modulation in the optical resonator.

3. The device as in claim 1, comprising:
an antenna that receives the input RF signal and couples the input RF signal to the RF circuit.

4. The device as in claim 1, comprising:
an optical detector optically coupled to the first optical resonator to receive light confined in the first optical resonator and to convert the received light into an RF signal; and
wherein the laser has an electrical input that receives the RF signal that modulates the laser for opto-electronic oscillation in the laser and the first optical resonator.

5. The device as in claim 1, wherein:
the laser is a diode laser that has first and second laser facets, wherein the first optical resonator is optically coupled to the first laser facet to receive laser light and the second optical resonator is optically coupled to the second laser facet to receive laser light.

6. The device as in claim 2, comprising:
an antenna that receives the input RF signal, and
wherein the RF circuit includes a signal combiner that combines the input RF signal from the antenna and the feedback signal from the electrical feedback into a combined signal, and the RF circuit applies the combined signal to the electrodes on the optical resonator.

7. The device as in claim 6, comprising:
an evanescent optical coupler coupled to the optical resonator to provide optical coupling between the laser and the optical resonator to stabilize the laser, the evanescent optical coupler operating to evanescently couple the modulated light confined in the optical resonator out as an output optical signal;
wherein the first optical detector is coupled to receive a first portion of the output optical signal and the second optical detector is coupled to receive a second portion of the output optical signal.

8. The device as in claim 7, comprising:
an optical coupler that splits the output optical signal from the evanescent optical coupler into the first portion and the second portion.

9. A photonic RF device, comprising:
a first photonic RF receiver that includes a first RF antenna to receive a first RF signal and to output a first baseband signal carried by the first RF signal; and
a second photonic RF receiver that includes a second RF antenna to receive a second RF signal and to output a second baseband signal carried by the second RF signal,
where each of the first and second photonic RF receivers includes
a laser that is tunable in response to a control signal and produces a laser beam at a laser frequency;
an optical resonator structured to support one or more optical whispering gallery modes and exhibiting an electro-optic effect in response to a control signal, the optical resonator being optically coupled to the laser to receive a portion of the laser beam into the optical resonator in a whispering gallery mode and to feed laser light in the whispering gallery mode in the optical resonator back to the laser via injection locking to stabilize the laser frequency at a frequency of the whispering gallery mode;
electrodes formed on the optical resonator to apply the control signal, which includes a respective input RF signal, to the optical resonator to cause optical modulation of light confined inside the optical resonator via the electro-optic effect so that the modulated light carries a respective baseband signal in the respective input RF signal;
a first optical detector coupled to detect modulated light coupled out of the optical resonator to produce a respective baseband signal of the respective input RF signal;
a second optical detector coupled to detect modulated light coupled out of the optical resonator to produce an electrical detector signal;
a feedback circuit that receives the electrical detector signal to produce an electrical feedback signal; and
a signal combiner that combines the electrical feedback signal from the second optical detector and the respective input RF signal from a respective RF antenna to produce the control signal;
wherein the feedback circuit in the first photonic RF receiver and the feedback circuit in the second photonic RF receiver are coupled to each other to combine the control signals in the first and second photonic RF receivers to synchronize the first and second photonic RF receivers.

10. The device as in claim 9, wherein each of the first and second photonic RF receivers includes:
an evanescent optical coupler coupled to the optical resonator to provide optical coupling between the laser and the optical resonator to stabilize the laser, the evanescent optical coupler operating to evanescently couple the modulated light confined in the optical resonator out as an output optical signal;
wherein the first optical detector is coupled to receive a first portion of the output optical signal and the second optical detector is coupled to receive a second portion of the output optical signal.

* * * * *